(12) United States Patent
Yoshida et al.

(10) Patent No.: US 10,017,850 B2
(45) Date of Patent: Jul. 10, 2018

(54) CU—GA ALLOY SPUTTERING TARGET, AND METHOD FOR PRODUCING SAME

(71) Applicant: MITSUBISHI MATERIALS CORPORATION, Tokyo (JP)

(72) Inventors: Yuuki Yoshida, Naka-gun (JP); Kouichi Ishiyama, Saitama (JP); Satoru Mori, Okegawa (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 183 days.

(21) Appl. No.: 14/908,346

(22) PCT Filed: Jul. 25, 2014

(86) PCT No.: PCT/JP2014/069735
§ 371 (c)(1),
(2) Date: Jan. 28, 2016

(87) PCT Pub. No.: WO2015/016153
PCT Pub. Date: Feb. 5, 2015

(65) Prior Publication Data
US 2016/0208376 A1    Jul. 21, 2016

(30) Foreign Application Priority Data

Aug. 1, 2013  (JP) ................. 2013-160134

(51) Int. Cl.
*C23C 14/34*    (2006.01)
*C22C 9/00*    (2006.01)
(Continued)

(52) U.S. Cl.
CPC ............ *C23C 14/3414* (2013.01); *B22F 3/16* (2013.01); *B22F 5/00* (2013.01); *C22C 1/0425* (2013.01);
(Continued)

(58) Field of Classification Search
CPC .......... B22F 3/16; B22F 5/00; B22F 2201/01; B22F 2301/10; B22F 2302/45;
(Continued)

(56) References Cited

U.S. PATENT DOCUMENTS 7,935,558 B1    5/2011  Juliano et al.
2012/0045360 A1  2/2012  Matsumura et al.
(Continued)

FOREIGN PATENT DOCUMENTS

CN    102362002 A    2/2012
CN    102395702 A    3/2012
(Continued)

OTHER PUBLICATIONS

Office Action dated Nov. 22, 2016, issued for the Japanese patent application No. 2013-160134 and English translation thereof.
(Continued)

*Primary Examiner* — Rodney G McDonald
(74) *Attorney, Agent, or Firm* — Locke Lord LLP

(57) ABSTRACT

The present invention provides a sputtering target of a Cu—Ga sintered body in which the oxygen content is further reduced and the abnormal discharging can be suppressed, and a method for producing the same. The sputtering target according to the present invention is a sintered body having: a texture in which Na compound phases are dispersed in a matrix with a γ phase and a ζ phase of a Cu—Ga alloy; and a component composition made of: 20 atomic % to 30 atomic % of Ga; 0.05 atomic % to 10 atomic % of Na; and the Cu balance and inevitable impurities including elements other than Na in the Na compound, wherein an average grain size of the γ phase is 30 μm to 100 μm, and an average grain size of the Na compound phases is equal to or less than 8.5 μm.

7 Claims, 4 Drawing Sheets

(51) Int. Cl.
*C22C 1/04* (2006.01)
*C22C 32/00* (2006.01)
*B22F 3/16* (2006.01)
*B22F 5/00* (2006.01)
*C23C 14/14* (2006.01)
*H01J 37/34* (2006.01)

(52) U.S. Cl.
CPC ............... *C22C 9/00* (2013.01); *C22C 32/00* (2013.01); *C23C 14/14* (2013.01); *H01J 37/3429* (2013.01); *B22F 2201/01* (2013.01); *B22F 2301/10* (2013.01); *B22F 2302/45* (2013.01); *B22F 2303/01* (2013.01); *B22F 2303/15* (2013.01); *B22F 2304/10* (2013.01)

(58) Field of Classification Search
CPC .......... B22F 2303/01; B22F 2303/15; B22F 2304/10; C22C 1/0425; C22C 32/00; C22C 9/00; C23C 14/14; C23C 14/3414; H01J 37/3429
USPC ...... 204/298.12, 298.13; 419/10, 48, 49, 57, 419/60
See application file for complete search history.

(56) References Cited

U.S. PATENT DOCUMENTS

2012/0217157 A1   8/2012   Zhang et al.
2013/0001078 A1   1/2013   Zhang et al.
2014/0034491 A1   2/2014   Zhang et al.

FOREIGN PATENT DOCUMENTS

| CN | 102753721 A | 10/2012 |
| EP | 2402482 A1 * | 1/2012 |
| JP | 10-135495 A | 5/1998 |
| JP | 2010-265544 A | 11/2010 |
| JP | 2011-214140 A | 10/2011 |
| JP | 2012-017481 A | 1/2012 |
| JP | 2012-233230 A | 11/2012 |
| WO | WO-2011/010529 A1 | 1/2011 |
| WO | 2012/147985 A1 | 11/2012 |
| WO | WO 2012/147985 * | 11/2012 |

OTHER PUBLICATIONS

Office Action dated Dec. 2, 2016, issued for the Chinese patent application No. 201480038680.4 and English translation thereof.
Search Report dated Feb. 28, 2017, issued for the European patent application No. 14831218.4.
Shogo Ishizuka et al., "Recent Developments in Chalcopyrite Solar Cell and Module Technologies," Journal of the Vacuum Society of Japan, vol. 53, No. 1, 2010, pp. 25-29 and partial translation thereof.
International Search Report dated Nov. 4, 2014, issued for PCT/JP2014/069735 and English translation thereof.

* cited by examiner

CU—GA ALLOY SPUTTERING TARGET, AND METHOD FOR PRODUCING SAME

TECHNICAL FIELD

The present invention relates to a Cu—Ga alloy sputtering target used in the formation of a Cu—In—Ga—Se compound film (abbreviated as CIGS film below) for forming a light-absorbing layer of a CIGS thin-film solar cell, and a method for producing the same.

Priority is claimed on Japanese Patent Application No. 2013-160134, filed Aug. 1, 2013, the content of which is incorporated herein by reference.

BACKGROUND ART

In recent years, a thin-film solar cell produced using a chalcopyrite compound semiconductor has been put into practical use. This thin-film solar cell produced using a compound semiconductor has a base structure in which a Mo electrode layer serving as a positive electrode is formed on a soda-lime glass substrate; a light-absorbing layer made of a CIGS film is formed on the Mo electrode layer; a buffer layer made of ZnS, CdS, or the like is formed on the light-absorbing layer; and a transparent electrode layer serving as a negative electrode is formed on the buffer layer.

As a method for forming a light-absorbing layer, for example, a method of forming a film by using a multi-component deposition method is known. In a light-absorbing layer obtained by using this method, high-energy conversion efficiency is obtained, but deposition is performed from a point source. Thus, when a film is formed on a substrate having a large area, uniformity of distribution in film thickness is easily degraded. For this reason, a method for forming a light-absorbing layer using a sputtering method has been proposed.

As the method for forming a light-absorbing layer using a sputtering method, the selenization method is used. In the selenization, first, an In film is deposited by sputtering using an In target; and a Cu—Ga binary alloy film is deposited by performing sputtering using a Cu—Ga binary alloy sputtering target on the In film. Next, a CIGS film is formed by heat treating the obtained the laminated precursor film, which is made of the In film and the Cu—Ga binary alloy film, in a Se atmosphere.

Furthermore, a technology, in which a laminated precursor film of the Cu—Ga alloy film and the In film is produced by using a sputtering method in order of a Cu—Ga alloy layer having a high content of Ga, a Cu—Ga alloy layer having a low content of Ga, and an In layer from a metal backside electrode layer side, and the produced laminated precursor film is heat treated in a selenium atmosphere and/or a sulfur atmosphere, has been proposed based on the above technologies (PTL 1). With this technology, the concentration gradient of Ga in the thin film light-absorbing layer is gradually (in stages) changed from an interface layer (buffer layer) side to the metal backside electrode layer side, and thereby a thin-film solar cell having a high open circuit voltage is obtained and separation of the thin film light-absorbing layer from other layers is prevented. In this case, it has been proposed that the content of Ga in the Cu—Ga alloy sputtering target be set to 1 to 40 atomic % (PTL 1).

As such a Cu—Ga alloy sputtering target for forming a Cu—Ga alloy layer, a Cu—Ga alloy sintered body sputtering target which is sintered by performing hot pressing on a Cu—Ga powder mixture produced by a water-atomizing device has been proposed (PTL 2). The Cu—Ga alloy sintered body sputtering target is formed of a single composition (uniform composition). Intensity of peaks other than a main peak ($\gamma$ phase: $Cu_9Ga_4$ phase) in a graph obtained by X-ray diffraction of the Cu—Ga alloy is equal to or 5% less than that of the main peak. An average crystal grain size thereof is 5 µm to 30 µm. The oxygen content obtained in the target is 350 ppm to 400 ppm.

On the other hand, in order to improve power generation efficiency of a light-absorbing layer formed from a CIGS film, it is believed that addition of Na to the light-absorbing layer through diffusion from an alkaline glass substrate is effective (NPL 1). However, in a case of a flexible CIGS solar cell using a polymer film or the like as a base instead of the alkaline glass, because the substrate is not an alkaline glass substrate, it is disadvantageous in that a supply source of Na is lost.

Regarding to the addition of Na, a method for forming a film of soda-lime glass between a Mo electrode layer and a substrate has been proposed (NPL 1). However, when a film of soda-lime glass is formed as in NPL 1, production processes are increased and productivity is degraded.

Because of this, a technology, in which a sodium compound is added to a Cu—In—Ga (referred to as CIG below) precursor film to provide a Na source to the light-absorbing layer, has been proposed as disclosed in PTL 3.

CITATION LIST

Patent Literature

[PTL 1] Japanese Unexamined Patent Application, First Publication No. H10-135495
[PTL 2] PCT International Publication No. WO2011/010529
[PTL 3] Specification of U.S. Pat. No. 7,935,558

Non-Patent Literature

[NPL 1] ISHIZUKA et al., "Recent Developments in Chalcopyrite Solar Cell and Module Technologies", Journal of the Vacuum Society of Japan, Vol 53, 2010 p. 25

SUMMARY OF INVENTION

Technical Problem

The above-described technologies in the related arts have the following problems.

In the technology disclosed in PTL 2, the Cu—Ga alloy sputtering target is produced by hot pressing. Thus, the oxygen content is reduced and the abnormal discharging in sputtering is reduced. However, from the viewpoint of producing a CIGS thin-film solar cell, a sputtering target having a even smaller oxygen content is demanded. As disclosed in PTL 2, in the sputtering target produced by using a dissolution method, the oxygen content can be significantly reduced to 40 ppm to 50 ppm, but an average grain size is significantly large so as to be 830 µm to 1100 µm. Thus, it has a problem in which abnormal discharging is increased.

When a sputtering target is produced by a production method disclosed in PTL 3, there are problems in that it is not possible to appropriately mix a nonconductive sodium compound into a CIG sputtering target made of a metal matrix; abnormal discharging occurs easily during sputtering; and stable formation of a film is difficult.

The present invention is made under the circumstances described above. The present invention relates to a sputtering target of a Cu—Ga sintered body. The object of the present invention is to provide a sputtering target of a Cu—Ga sintered body with reduced oxygen content, and the abnormal discharging is suppressed in the presence of Na at a high concentration; and the method for producing the sputtering target.

Solution to Problem

The present invention includes the following aspects in order to solve the above-described problems.

(1) A Cu—Ga alloy sputtering target that is a sintered body having:
a texture in which Na compound phases are dispersed in a matrix with a γ phase and a ζ phase of a Cu—Ga alloy; and
a component composition made of: 20 atomic % to 30 atomic % of Ga; 0.05 atomic % to 10 atomic % of Na; and the Cu balance and inevitable impurities including elements other than Na in the Na compound, wherein
an average grain size of the γ phase is 30 μm to 100 μm, and
an average grain size of the Na compound phases is equal to or less than 8.5 μm.

(2) The Cu—Ga alloy sputtering target according to the above-described (1), wherein
a maximum grain size of the Na compound phases is equal to or less than 20 μm.

(3) The Cu—Ga alloy sputtering target according to the above-described (1) or (2), wherein
a main peak intensity in X-ray diffraction attributed to the ζ phase is equal to or more than 5% of a main peak intensity in X-ray diffraction attributed to the γ phase.

(4) The Cu—Ga alloy sputtering target according to any one of the above-described (1) to (3), wherein
the Na compound phases are formed of at least one or more of NaF, $Na_2S$, $Na_2Se$, and $Na_3AlF_6$.

(5) The Cu—Ga alloy sputtering target according to any one of the above-described (1) to (4), wherein
an oxygen content of the sintered body is equal to or less than 200 mass ppm.

(6) A method of producing the Cu—Ga alloy sputtering target according to any one of the above-described (1) to (5), the method comprising the step of performing pressureless sintering by heating a molded body formed from a powder mixture of a pure Cu powder, a Cu—Ga alloy powder, and a Na compound, in a reducing atmosphere.

The γ phase and the ζ phase in the present invention correspond to the γ phase (chemical formula: $Cu_9Ga_4$) and the ζ phase (chemical formula: $Cu_3Ga$) in the phase diagram of the Cu—Ga alloy shown in FIG. 1.

In the method for producing a sputtering target disclosed in PTL 3, Na is added to a CIG alloy. On the contrary, in the present invention, Na is added as a Na compound form to a Cu—Ga alloy instead of pure Na. In addition to that, coarsening of a Na compound phase is suppressed; the oxygen content in the sputtering target is limited; and an average grain size of the γ phase in the sputtering target is optimized in the present invention. Thus, a Na-containing sputtering target in which abnormal discharging is suppressed is obtained.

The reason for the Na content contained as a form of the Na compound being set to have the above range is because if the Na content exceeds 10 atomic %, ensuring sufficient sintered density is impossible and the abnormal discharging during sputtering is increased. If the Na content is less than 0.05 atomic %, the Na content in the film is insufficient and the intended addition of Na cannot be achieved practically.

The sintered body of the Cu—Ga alloy sputtering target according to the present invention is a metal matrix in which a γ phase and a ζ phase are present together. In the matrix, the average grain size of the γ phases is 30 μm to 100 μm. The matrix has a texture in which Na compound phases are dispersed in the matrix. In the matrix, the average grain size of the Na compound phases is equal to or less than 8.5 μm. Considering the cost in manufacturing of the sputtering target and the obtained advantageous effects, a lower limit value of the average grain size of the Na compound phase is preferably 5.0 μm, but is not limited thereto. The average grain size herein corresponds to a projected area equivalent circle diameter.

Since the Na compound-containing sputtering target contains a Na compound which is an insulating material, if the Na compound phases are not appropriately dispersed, abnormal discharging occurs easily during sputtering. The present inventors found that the abnormal discharging due to the Na compound is significantly reduced if the average grain size of the Na compound phases is equal to or less than 8.5 μm.

In the sputtering target according to the present invention, as described above, a film can be formed rapidly through sputtering by optimizing the average grain size of the Na compound phases. That is, in the sputtering target according to the present invention, stable sputtering, in which the abnormal discharging due to the Na compound is suppressed, can be performed by setting the average grain size of the Na compound phases to be equal to or less than 8.5 μm. The size of the Na compound phase dispersed in the sputtering target is preferably as small as possible. The size thereof is set to be equal to or less than 8.5 μm in average grain size, but is preferably set to be equal to or less than 20 μm in maximum grain size. Considering the cost in manufacturing of the sputtering target and the obtained advantageous effects, the preferable minimum grain size is 0.5 μm, but is not limited thereto.

It is preferable that the oxygen content is equal to or less than 200 mass ppm in the Cu—Ga alloy sputtering target according to the present invention.

If oxygen is present in the Cu—Ga alloy sputtering target into which the Na compound is added, there is a chance that oxygen and the Na compound react with each other and NaO having a high hygroscopic property is generated. Particularly, if the oxygen content exceeds 200 mass ppm, a probability of occurrence of abnormal discharging in the sputtering target is high. Thus, the oxygen content is set to be equal to or less than 200 mass ppm. Considering the cost in manufacturing of the sputtering target and the obtained advantageous effects, a lower limit value of the oxygen content is preferably 50 mass ppm, but is not limited thereto.

In the Cu—Ga alloy sputtering target according to the present invention, since the average grain size of the γ phases in the metal matrix is 30 μm to 100 μm, the coarse Na compound phase is not generated even though the Na compound is contained. If the average grain size of the γ phases exceeds 100 μm, the Na compound phase is easily coarsened. Thus, it is not preferable. If the average grain size of the γ phases is less than 30 μm, the oxygen content easily exceeds 200 mass ppm. Thus, it is not preferable.

As explained above, in the Cu—Ga alloy sputtering target according to the present invention, the γ phase and the ζ phase are present together in the metal matrix. The average grain size of the γ phases is 30 μm to 100 μm. The Na compound phases having an average grain size which is equal to or less than 8.5 μm are finely dispersed in the matrix. The oxygen content is equal to or less than 200 mass ppm. Thus, the oxygen content is low and the grain size is small. Thus, the abnormal discharging is significantly reduced.

The reason for the content of Ga being equal to or greater than 20 atomic % is because the average grain size of the γ phases is reduced and the oxygen content is easily increased if the content of Ga is less than 20 atomic %. The reason for the content of Ga being equal to or less than 30 atomic % is because the proportion of the ζ phase is reduced, the average grain size of the γ phases is increased, and the coarse Na compound phase is easily generated if the content of Ga exceeds 30 atomic %. As the Na compound, at least one or more of NaF, $Na_2S$, $Na_2Se$, and $Na_3AlF_6$ may be used. Here, F, S, Se, and Al, which are elements other than Na in the Na compound, serve as impurities in a target composition and are included in unavoidable impurities.

The method for producing a Cu—Ga alloy sputtering target according to the present invention corresponds to the above-described method for producing a Cu—Ga alloy sputtering target according to the present invention. The method for producing a Cu—Ga alloy sputtering target according to the present invention includes a step of performing pressureless sintering by heating a molded body formed from a powder mixture of a pure Cu powder, a Cu—Ga alloy powder, and a Na compound, in a reducing atmosphere.

That is, in this method for producing a Cu—Ga alloy sputtering target, pressureless sintering is performed in such a manner that a molded body formed from a powder mixture of a pure Cu powder, a Cu—Ga alloy powder, and a Na compound is heated in a reducing atmosphere. Thus, a sintered body which has significantly lower oxygen content is obtained. At this time, in the sintered body, mutual diffusion occurs from the raw material powders thereof during sintering, and the γ phase and the ζ phase appear as a metal phase in the sintered body. Then, a sintered body, in which an X-ray diffraction peak attributed to the γ phase of the Cu—Ga alloy and an X-ray diffraction peak attributed to the ζ phase are observed, is obtained with extremely low oxygen content.

By using pure copper powder, which is plastically deformed easily, as a raw material, holding a shape during obtaining molded body becomes easy. The pure copper powder is oxidized in the air at the room temperature. However, it won't be a cause of oxygen content increase, since the oxidized pure copper powder is easily reduced in heating in a reducing atmosphere. Furthermore, by using a Cu—Ga alloy powder including 50 atomic % of Ga, a liquid phase is formed during sintering and a high-density sintered body can be obtained.

Advantageous Effects of Invention

According to the present invention, the following advantageous effects are obtained.

That is, according to the Cu—Ga alloy sputtering target and the method for producing the same which relates to the present invention: the main peak intensity in X-ray diffraction attributed to the ζ phase is equal to or more than 5% of the main peak intensity in X-ray diffraction attributed to the γ phase; the γ phase and the ζ phase are present in the sintered body; the average grain size of the γ phase is small such as 30 μm to 100 μm; the Na compound phases having an average grain size which is equal to or less than 8.5 μm are dispersed in the sintered body. Because of these, a Cu—Ga alloy sputtering target with low oxygen content and small grain size is obtained. Therefore, abnormal discharging is significantly reduced and increase of oxygen amount in the precursor film obtained by sputtering is suppressed.

Accordingly, by depositing a light-absorbing layer of a CIGS thin-film solar cell by a sputtering method using the sputtering target related to the present invention, the photoelectric conversion efficiency of the light-absorbing layer can be improved and a solar cell having high power generation efficiency can be manufactured.

DESCRIPTION OF EMBODIMENTS

Hereinafter, embodiments of a Cu—Ga alloy sputtering target and a method for producing the same according to the present invention are described.

A sputtering target of the present embodiment is a sintered body having a component composition made of: 20 atomic % to 30 atomic % of Ga; 0.05 atomic % to 10 atomic % of Na; and the Cu balance and inevitable impurities including elements other than Na in the Na compound. In the metal matrix of the sintered body, a γ phase ($Cu_9Ga_4$ phase) and a ζ phase ($Cu_3Ga$ phase) of a Cu—Ga alloy co-exist, and has a texture in which Na compound phases are dispersed. The average grain size of the γ phase is 30 μm to 100 μm. In addition, the average grain size of the Na compound phases is equal to or less than 8.5 μm. The maximum grain size of the Na compound phases is equal to or less than 20 μm. In addition, the oxygen content of the sintered body is equal to or less than 200 mass ppm.

Figure 5:
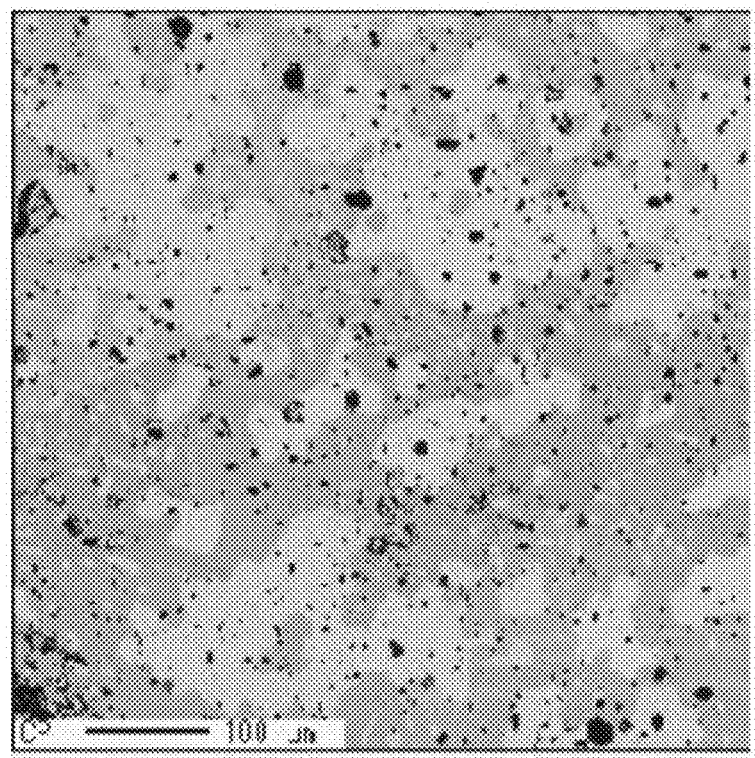
FIG. 5 is a compositional image (COMPO image) obtained by an electron beam probe microanalyser (EPMA), regarding the sputtering target of Example 2 which contains 22.9 atomic % of Ga.

The sputtering target has a crystal texture in which γ phases (Ga-rich region: $Cu_9Ga_4$ phase) are dispersed, and this γ phase contains more Ga than that in the sintered body. The Ga-rich region is, for example, an area observed to be white in a COMPO image obtained by an EPMA, as shown in FIG. 5.

The average grain size of the γ phase is obtained in the following manner. A surface of a sample cut out from the sputtering target is polished so as to become a mirror surface, and is etched by using an etchant which is formed from nitric acid and pure water. Then, a microphotograph is captured by an optical microscope which can distinguish a crystal particle boundary at a magnification of a range from 50 times to 1000 times, and 10 straight lines for dividing one side of the obtained photograph into 11 equal parts are drawn. The number of crystal particles through which the 10 straight lines pass is calculated, and the average grain size of the γ phase is obtained by the following calculation expression.

Average grain size=(value obtained by correcting lengths of the 10 straight lines on the photograph to be actual lengths)/(the number of crystal particles through which the 10 straight lines pass)

Figure 7:
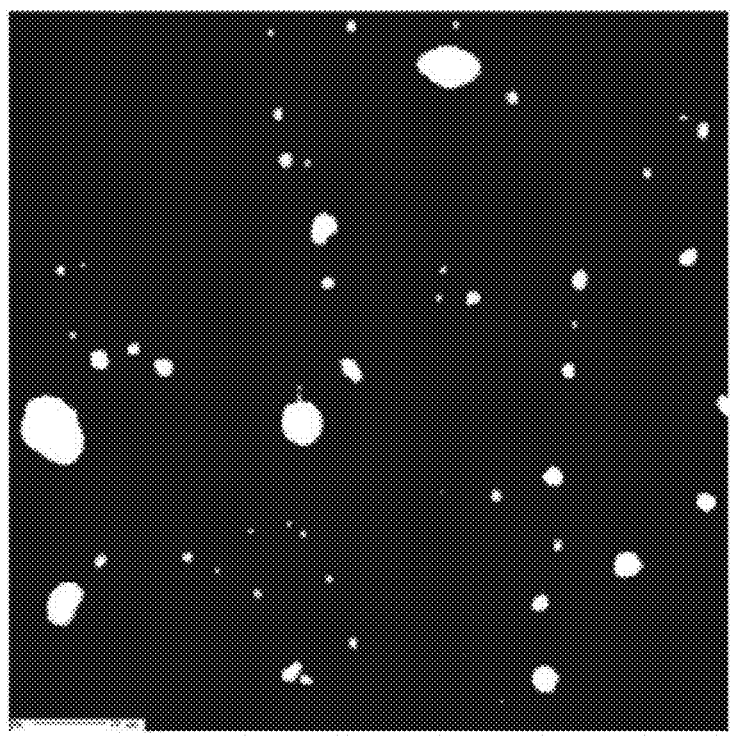
FIG. 7 is an element distribution mapping image of Na obtained by the EPMA, regarding the sputtering target of Example 2 which contains 22.9 atomic % of Ga.

The average grain size of the Na compound phases is measured based on an element distribution mapping image of Na obtained by the EPMA, as shown in FIG. 7. In the image of FIG. 7, a white area indicates the presence of Na and represents the size of the Na compound phase. An occupied area S (μm$^2$) is measured and obtained by setting this white area as one Na compound particle. The grain size D of the Na compound phase is obtained from an expression of grain size D=(S/π)$^{1/2}$. An average grain size (average value of D) and the maximum grain size (maximum value of D) are calculated from the number of Na compound particles observed in 10 square areas having one side of 100 μm, and grain sizes D.

The oxygen content is measured by an infrared absorbing method which is described in "General rules for determination of oxygen in metallic materials" of JIS Z 2613.

The method for producing a sputtering target in the present embodiment has a step of performing pressureless sintering by heating a molded body in a reducing atmosphere. The molded body is formed from a powder mixture of a pure Cu powder, a Cu—Ga alloy powder, and a Na compound.

An example of the production method is described in detail below. First, a pure Cu powder in which D50 measured by Microtrac is 2 μm to 3 μm, a Cu—Ga alloy atomized powder in which D50 is 20 μm to 30 μm, and a Na compound sieved to cause D50 to be 10 μm to 20 μm are weighed so as to be a target composition, and are mixed with each other in an Ar atmosphere by using a Henschel mixer to obtain a powder mixture. The Cu—Ga alloy atomized powder is manufactured in such a manner that a Cu—Ga alloy is dissolved in a gas-atomizing device so as to cause the concentration of Ga to be 50 atomic %, and is atomized by using an Ar gas.

Then, a green compact (molded body) is obtained at a molding pressure of 500 kgf/cm$^2$ to 2000 kgf/cm$^2$ by using the obtained powder mixture. The green compact is arranged in a furnace. A reducing gas is flowed at 10 L/min to 100 L/min, and the green compact is heated up to a sintering temperature of 700° C. to 1000° C. at 10° C./min and is held for 5 hours. Then, the inside of the furnace is naturally cooled, and lathe work is performed on a surface portion and on an outer circumference portion of the obtained sintered body. Thereby, a sputtering target having a diameter of 50 mm and a thickness of 6 mm is manufactured.

Then, the processed sputtering target is hot pressed by using a Cu backing plate and is used in sputtering.

The Cu—Ga alloy sputtering target manufactured in this manner is used in a direct-current (DC) magnetron sputtering device by using an Ar gas as a sputtering gas.

In the Cu—Ga alloy sputtering target of the present embodiment, the main peak intensity in X-ray diffraction attributed to the ζ phase is equal to or more than 5% of the main peak intensity in X-ray diffraction attributed to the γ phase. The oxygen content is equal to or less than 200 mass ppm and the average grain size of the γ phases of the Cu—Ga alloy is equal to or less than 100 μm. Thus, the Na compound phases having an average grain size which is equal to or less than 8.5 μm are dispersed and the maximum grain size thereof is suppressed so as to be equal to or less than 20 μm. Accordingly, the abnormal discharging is significantly reduced.

An increase of an amount of oxygen in a precursor film obtained through sputtering is suppressed by significantly reducing the oxygen content and it is possible to contribute to improvement of photoelectric conversion efficiency in a light-absorbing layer of a CIGS thin-film solar cell.

In the method for producing a sputtering target in the present embodiment, pressureless sintering is performed by heating the molded body formed from the powder mixture of the pure Cu powder, the Cu—Ga alloy powder, and the Na compound, in the reducing atmosphere. Thus, mutual diffusion occurs from the raw material powders thereof during sintering, and the γ phase and the ζ phase appear as a metal phase in the sintered body. As a result, the sintered body, in which an X-ray diffraction peak attributed to the γ phase of the Cu—Ga alloy and an X-ray diffraction peak attributed to the ζ phase are observed, with extremely low oxygen content is obtained.

Figure 1:
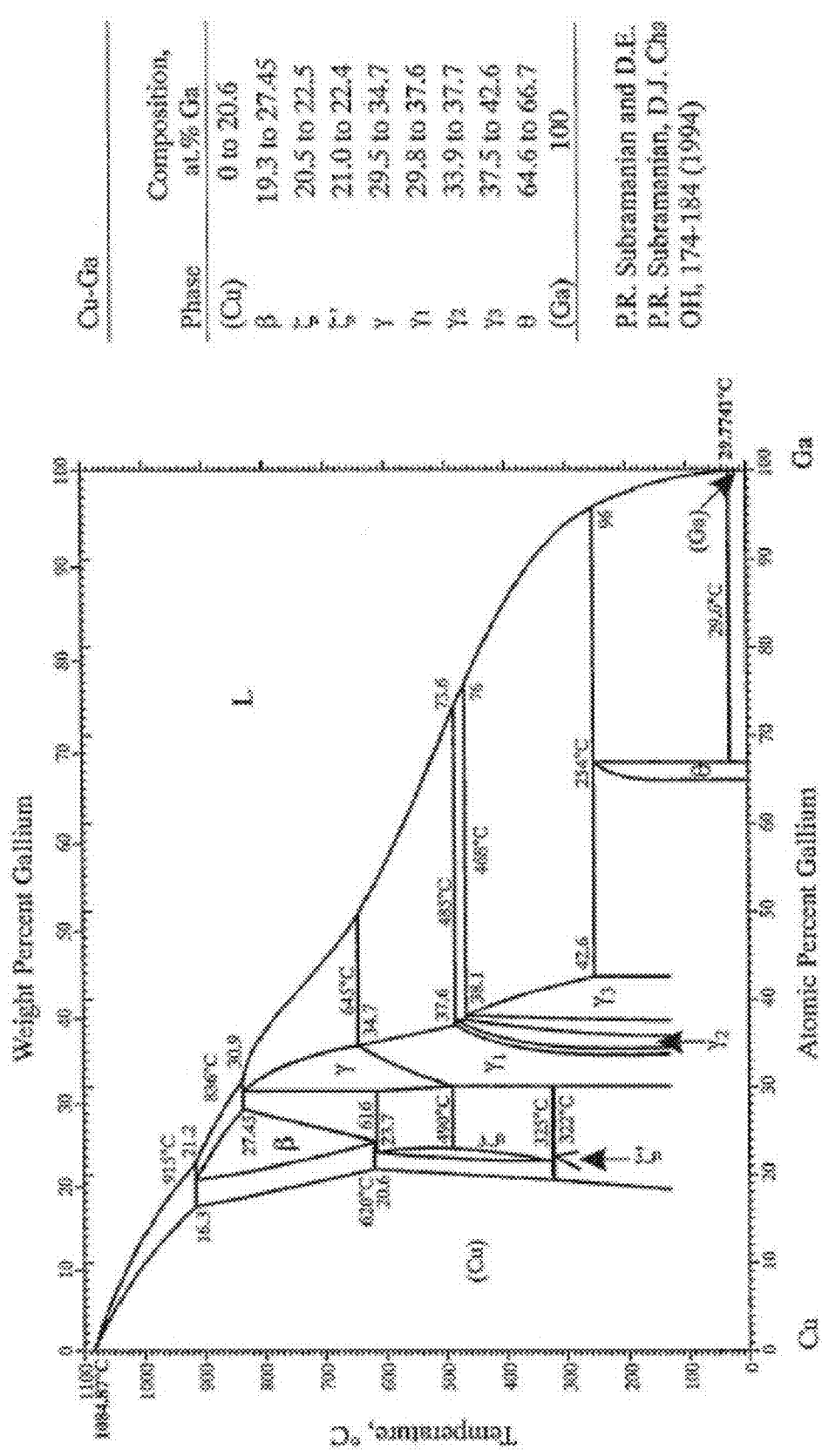
FIG. 1 shows a phase diagram of a Cu—Ga alloy.

The reason for two phases of the γ phase and the ζ phase being present together is as follows. That is, a Ga-rich liquid phase appears from the Cu—Ga alloy powder, and so-called liquid phase sintering is performed in sintering. Thus, particles are easily rearranged and a high-density sintered body is obtained while a powder is sintered at normal pressure. In the process of cooling the sintered body, the sintered body is separated into the γ phase and the ζ phase at the vicinity of 620° C. According to the Cu—Ga phase diagram (source of reference, Desk Handbook: Phase Diagrams for Binary Alloys (ASM International)) shown in FIG. 1, it is expected that this phase separation necessarily occurs when an atom ratio of Ga is less than 30%. An advantage of coexistence of the two phases is that coarsening of a crystal particle in the γ phase is suppressed by the presence of the ζ phase, the average grain size of a target structure becomes small, and the abnormal discharging during sputtering is less likely to occur.

EXAMPLES

Next, results obtained by evaluating the sputtering target and the method for producing the same according to the present invention using examples manufactured based on the embodiments are described below.

First, mixed powders of Examples 1 to 11 were prepared by blending the Cu—Ga alloy atomized powder (CuGa powder in the table), Ga concentration of which was 50 atomic %; the Cu powder; and the Na compound (NaF, Na$_2$S, Na$_2$Se, and Na$_3$AlF$_6$), so as to have a weight ratio shown in Table 1. Next, green compacts (molded body) were formed at the molding pressure of 1500 kgf/cm$^2$ by using each of the obtained mixed powders. As shown in Table 2, Examples 1 to 7 among the mixed powders were subjected to pressureless sintering in a hydrogen atmosphere. Examples 8 and 9 were subjected to pressureless sintering in a carbon monoxide atmosphere. Examples 10 and 11 were subjected to pressureless sintering in an atmosphere of an ammonia decomposition gas. The pressureless sintering was performed by holding the powder mixture at the sintering temperature of 840° C. for 5 hours with a reducing gas flowing at 50 L/min.

As comparative examples, mixed powders of Comparative Examples 1 to 5 were prepared by blending the Cu—Ga alloy atomized powder (CuGa powder in the table), Ga concentration of which was 50 atomic %; the Cu powder; and the Na compound (NaF, Na$_2$S. Na$_2$Se, and Na$_3$AlF$_6$), so as to have a weight ratio shown in Table 1. In Comparative Examples 3 and 4, the Cu—Ga alloy powder was blended so as to cause the content of Ga to be out of range defined in the scope of the present invention. In Comparative Example 5, an excess of Na compound was blended. Then, a green compacts (molded body) were formed by using each of the obtained mixed powders, similarly to the above-explained Examples.

As shown in Table 2, Comparative Example 1 among the mixed powders was subjected to pressureless sintering in an air atmosphere. Comparative Example 2 was sintered in a vacuum by using a hot pressing method. A condition of hot pressing was a holding time of 60 min at a holding temperature of 740° C. Comparative Examples 3 to 5 were subjected to pressureless sintering in a hydrogen atmosphere, similarly to the above-explained Examples.

In Table 2, results of composition analysis relating to Ga, Na, and Cu in sputtering targets of Examples 1 to 11 and Comparative Examples 1 to 5 are shown in a "target composition (atomic %)" field. This composition of each of the targets was measured by using an ICP method (high-frequency inductively-coupled plasma method).

TABLE 1

| | Raw material blending ratio (weight %) | | | | |
|---|---|---|---|---|---|
| | Cu | CuGa | NaF | Na₂S | Na₂Se | Na₂₃AlF₆ |
| Example 1 | 52.4 | 44.1 | 3.5 | — | — | — |
| Example 2 | 46.0 | 50.5 | — | — | — | 3.5 |
| Example 3 | 40.0 | 57.1 | 1.7 | 1.2 | — | — |
| Example 4 | 39.9 | 59.4 | 0.7 | — | — | — |
| Example 5 | 45.3 | 51.8 | 1.0 | — | 1.9 | — |
| Example 6 | 31.7 | 62.9 | — | 2.0 | — | 3.4 |
| Example 7 | 32.6 | 60.0 | 7.4 | — | — | — |
| Example 8 | 42.7 | 56.8 | — | — | — | 0.5 |
| Example 9 | 40.2 | 55.6 | 0.7 | — | — | 3.5 |
| Example 10 | 46.4 | 48.6 | 5.0 | — | — | — |
| Example 11 | 43.2 | 54.3 | — | — | 0.9 | 1.6 |
| Comparative Example 1 | 45.0 | 52.6 | 2.4 | — | — | — |
| Comparative Example 2 | 43.4 | 55.0 | — | — | — | 1.6 |
| Comparative Example 3 | 56.3 | 40.6 | 3.1 | — | — | — |
| Comparative Example 4 | 31.1 | 65.5 | — | — | — | 3.4 |
| Comparative Example 5 | 38.7 | 51.6 | 5.8 | — | — | 3.9 |

TABLE 2

| | Sintering atmosphere | Target composition (atomic %) | | |
|---|---|---|---|---|
| | | Ga | Na | Cu |
| Example 1 | Hydrogen | 20.3 | 5.1 | Balance |
| Example 2 | Hydrogen | 22.9 | 2.8 | Balance |
| Example 3 | Hydrogen | 26.7 | 4.4 | Balance |
| Example 4 | hydrogen | 29.1 | 1.0 | Balance |
| Example 5 | Hydrogen | 24.4 | 3.5 | Balance |
| Example 6 | Hydrogen | 28.0 | 5.9 | Balance |
| Example 7 | Hydrogen | 25.3 | 9.7 | Balance |
| Example 8 | Carbon Monoxide | 27.5 | 0.5 | Balance |
| Example 9 | Carbon Monoxide | 24.7 | 4.2 | Balance |
| Example 10 | Ammonia Decomposition Gas | 21.2 | 6.8 | Balance |
| Example 11 | Ammonia Decomposition Gas | 25.6 | 2.6 | Balance |
| Comparative Example 1 | Air | 24.5 | 3.6 | Balance |
| Comparative Example 2 | Vacuum | 25.8 | 1.3 | Balance |
| Comparative Example 3 | Hydrogen | 18.3 | 4.6 | Balance |
| Comparative Example 4 | Hydrogen | 30.4 | 2.9 | Balance |
| Comparative Example 5 | Hydrogen | 21.2 | 10.5 | Balance |

Regarding the sputtering targets of Examples of the present invention and the sputtering targets of Comparative Examples which were manufactured in this manner, results obtained by examining average grain sizes of the γ phases and the Na compound phases, the maximum grain size of the Na compound phases, analysis by X-ray diffraction, the oxygen content, and the number of occurrences of abnormal discharge are shown in Table 3.

TABLE 3

| | Average grain size of γ phase (μm) | Average grain size of Na compound (μm) | Maximum grain size of Na compound (μm) | X-ray diffraction | Oxygen content (mass ppm) | Abnormal discharge (times) |
|---|---|---|---|---|---|---|
| Example 1 | 40 | 3.7 | 9.3 | γ, ζ | 180 | 1 |
| Example 2 | 50 | 4.4 | 9.7 | γ, ζ | 130 | 0 |
| Example 3 | 70 | 5.9 | 13.0 | γ, ζ | 110 | 0 |
| Example 4 | 80 | 5.1 | 12.2 | γ, ζ | 80 | 0 |
| Example 5 | 60 | 4.4 | 11.0 | γ, ζ | 90 | 0 |
| Example 6 | 90 | 8.3 | 19.1 | γ, ζ | 70 | 1 |
| Example 7 | 80 | 7.9 | 18.2 | γ, ζ | 70 | 0 |
| Example 8 | 80 | 4.8 | 10.1 | γ, ζ | 100 | 0 |
| Example 9 | 70 | 4.4 | 8.4 | γ, ζ | 80 | 0 |
| Example 10 | 50 | 7.7 | 16.2 | γ, ζ | 160 | 0 |
| Example 11 | 80 | 5.2 | 12.0 | γ, ζ | 100 | 0 |
| Comparative Example 1 | 20 | 15.0 | 36.0 | γ, ζ | 400 | 13 |
| Comparative Example 2 | 20 | 18.3 | 36.6 | γ, ζ | 350 | 5 |

TABLE 3-continued

|  | Average grain size of γ phase (μm) | Average grain size of Na compound (μm) | Maximum grain size of Na compound (μm) | X-ray diffraction | Oxygen content (mass ppm) | Abnormal discharge (times) |
| --- | --- | --- | --- | --- | --- | --- |
| Comparative Example 3 | 10 | 4.0 | 7.6 | γ, ζ | 290 | 6 |
| Comparative Example 4 | 130 | 8.9 | 22.3 | γ | 60 | 3 |
| Comparative Example 5 | 70 | 10.1 | 24.2 | γ, ζ | 100 | 4 |

In the analysis by X-ray diffraction, both the diffraction peaks attributed to the γ phase and the diffraction peak attributed to the ζ phase were observed. When the intensity of the main peak in the diffraction peak attributed to the ζ phase was equal to or 5% greater than the intensity of the main peak of the diffraction peak attributed to the γ phase, it is indicated by "γ, ζ" in Table 3. When the intensity of the main peak in the diffraction peak attributed to the ζ phase was 5% less than the intensity of the main peak of the diffraction peak attributed to the γ phase, it is indicated by "γ" in Table 3.

Device and a measurement condition used in this analysis are as follows.
Device: RINT-Ultima/PC manufactured by Rigaku Corporation.
Tube: Cu
Tube voltage: 40 kV
Tube current: 40 mA
Scanning range (2θ): 20° to 120°
Measurement step width: 0.02° at 2θ
Scanning speed: 2° per minute Regarding abnormal discharge, sputtering was performed under the following film formation condition for 12 hours and the number of occurrences of abnormal discharge was measured.
Power: Pulse DC500 W
Total pressure: 0.4 Pa
Sputtering gas: Ar=47.5 sccm, $O_2$=2.5 sccm
Target-Substrate (TS) distance: 70 mm Number of occurrences of abnormal discharge was measured by using the arc-counting function of the DC power source (type number: RPDG-50A) manufactured by MKS Instruments Inc.

As can be understood from these results, in any one of the sputtering targets of Examples according to the present invention, the average grain size of the γ phase was as small as 40 μm to 90 μm, and the two phases of the γ phase and the ζ phase in X-ray diffraction were observed. In the sputtering targets of these Examples, the oxygen content was significantly low at 70 mass ppm to 180 mass ppm, and the average grain size and the maximum grain size of the Na compound phase were small. Thus, the number of occurrences of abnormal discharge was significantly reduced so as to be equal to or less than one time.

On the contrary, in the sputtering target of Comparative Example 1 subjected to pressureless sintering in air, the oxygen content was high as 400 mass ppm, and the number of occurrences of abnormal discharge was significantly increased to 13 times. In the sputtering target of Comparative Example 3 having a small amount of Ga which is out of the composition range defined in the scope of the present invention, the oxygen content was increased to 290 mass ppm and the number of occurrences of abnormal discharge was also significantly increased to 6 times. In the sputtering target of Comparative Example 4 having a large amount of Ga which was out of the composition range defined in the scope of the present invention, it turned into a single-phase texture of the γ phase mostly and the number of occurrences of abnormal discharge was also significantly increased to 3 times.

In the sputtering target of Comparative Example 2 sintered by using the hot pressing method, the oxygen content was increased to 350 mass ppm and the number of occurrences of abnormal discharge was also significantly increased to 5 times.

Figure 2:
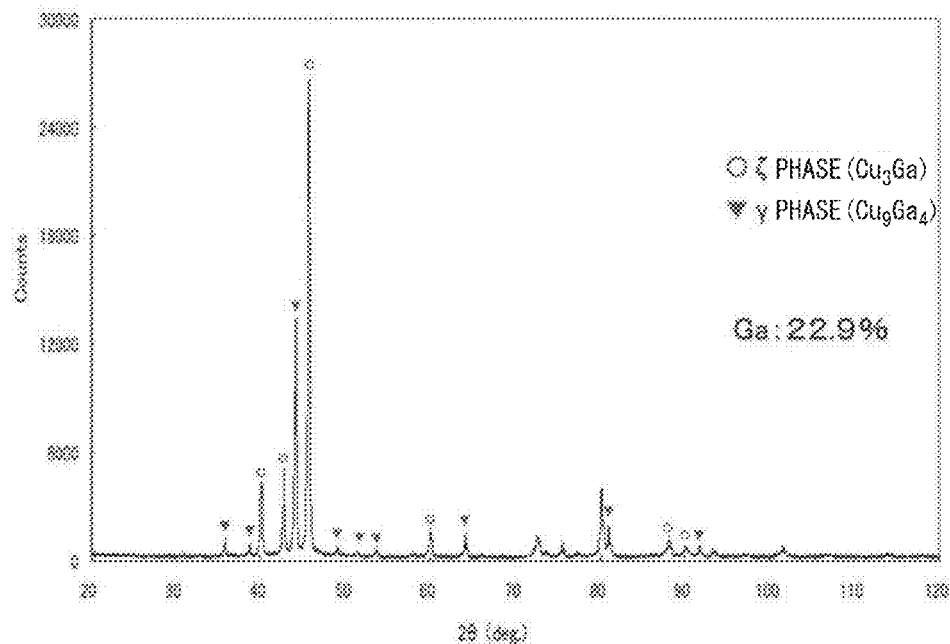
FIG. 2 is a graph illustrating a diffraction peak measured by X-ray diffraction, regarding a sputtering target of Example 2 which contains 22.9 atomic % of Ga.
Figure 3:
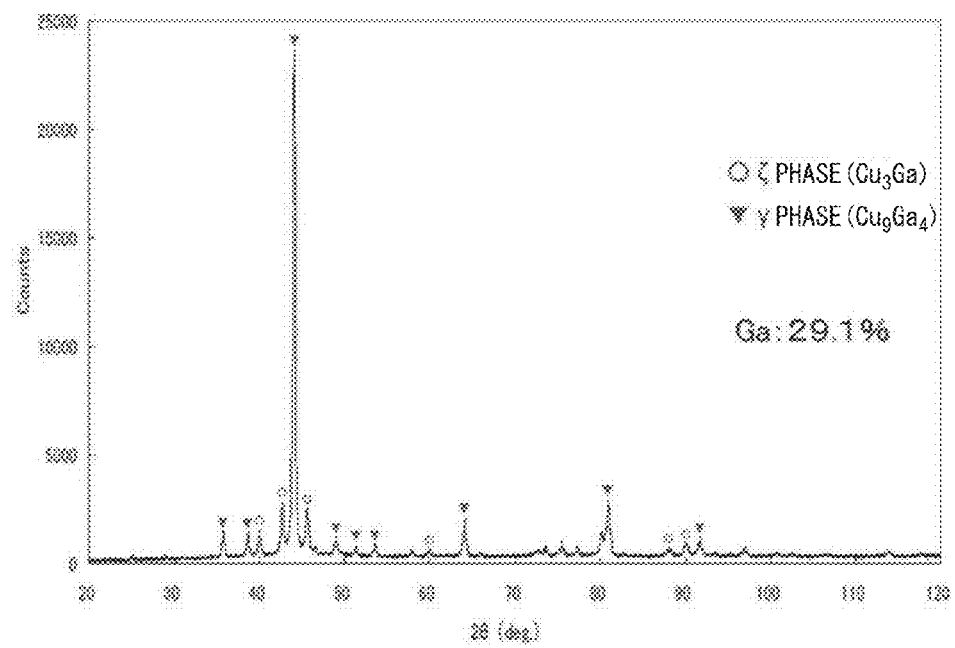
FIG. 3 is a graph illustrating a diffraction peak measured by X-ray diffraction, regarding a sputtering target of Example 4 which contains 29.1 atomic % of Ga.
Figure 4:
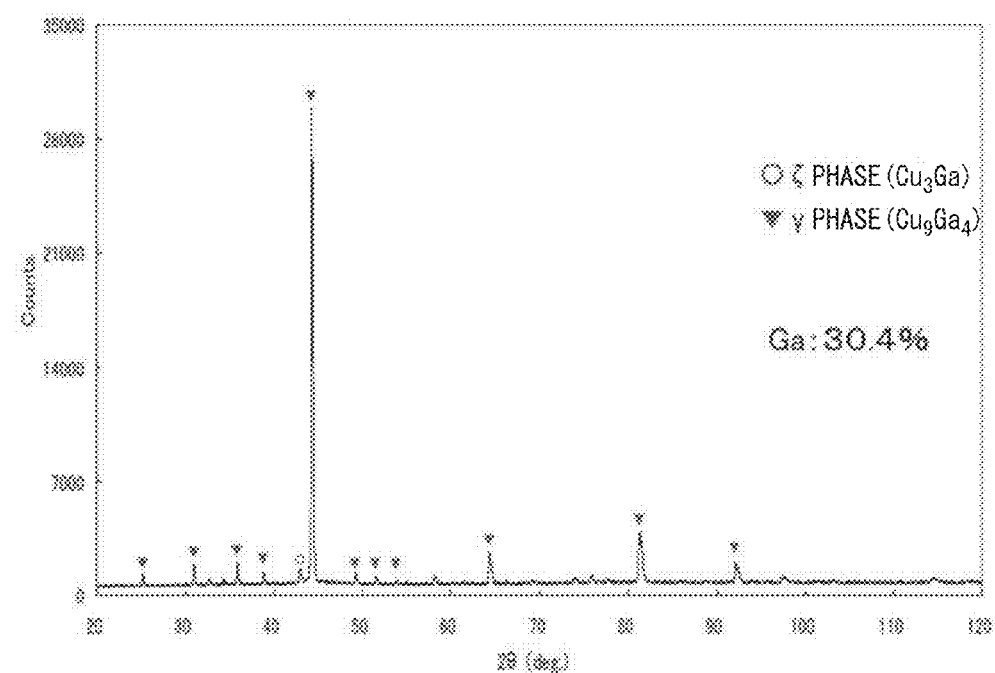
FIG. 4 is a graph illustrating a diffraction peak measured by X-ray diffraction, regarding a sputtering target of Comparative Example 4 which contains 30.4 atomic % of Ga.

Next, Examples according to the present invention and Comparative Examples in which the content of Ga was set to 22.9 atomic %, 29.1 atomic %, and 30.4 atomic % were manufactured by performing pressureless sintering in which the sintered body was held at the sintering temperature of 840° C. for 5 hours while flowing hydrogen gas at 50 L/min. Results obtained by measuring diffraction peaks of Examples and Comparative Examples through X-ray diffraction (XRD) are shown in FIGS. 2 to 4.

As can be understood from these results, in the sputtering target in which the content of Ga was 22.9 atomic % and 29.1 atomic %, both of the diffraction peak attributed to the γ phase ($Cu_9Ga_4$ phase) of CuGa and the diffraction peak attributed to the ζ phase ($Cu_3Ga$ phase) were observed. Intensity of the main peak in the diffraction peak attributed to the ζ phase was equal to or 5% greater than the intensity of the main peak in the diffraction peak attributed to the γ phase. Thus, it can be understood that the two phases of the γ phase and the ζ phase were clearly formed in the texture. However, when the content of Ga was 30.4 atomic %, the intensity of the diffraction peak attributed to the ζ phase was less than 5%. Thus, it can be understood that the texture was formed of the single-phase of the γ phase mostly.

Figure 6:
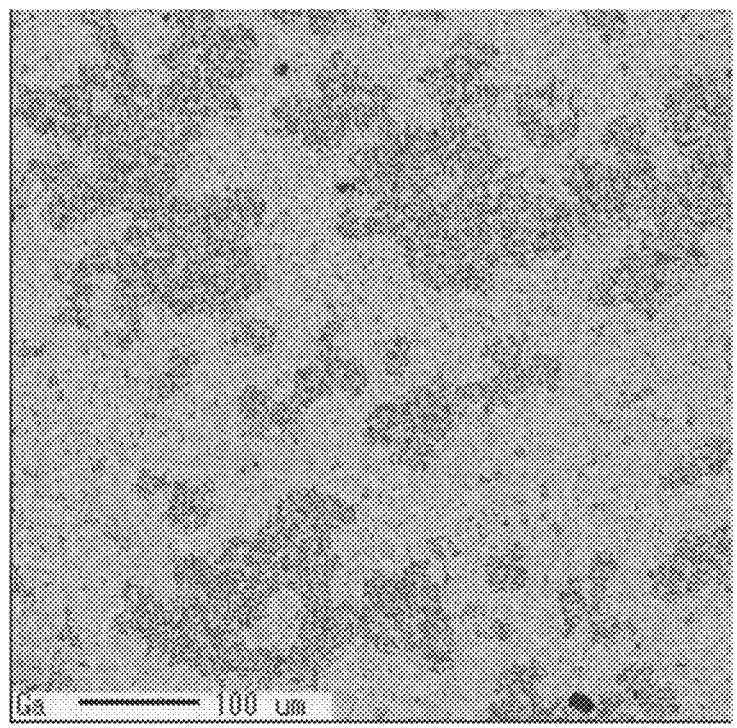
FIG. 6 is an element distribution mapping image of Ga obtained by the EPMA, regarding the sputtering target of Example 2 which contains 22.9 atomic % of Ga.

Next, the sputtering target of Example 2 which contains 22.9 atomic % of Ga was manufactured by performing pressureless sintering in which the sintered body was held at the sintering temperature of 840° C. for 5 hours while flowing hydrogen gas at 50 L/min. A compositional image (COMPO image) and an element-mapping image of Ga which were obtained by observing the obtained structure using the EPMA are shown in FIGS. 5 and 6. In the COMPO image, the whitest portion indicates an area in which the content of Ga was high relatively to the sintered body. Although the original image of the element-mapping image of Ga is a color image, an image obtained by converting the original image into a monochrome image using a gray scale is shown. In the image, a portion having low brightness has a high Ga content. As can be understood from these images, the examples according to the present invention have a crystal texture in which phases (Ga-rich region) having more Ga than the sintered body were dispersed.

In order to use the examples of the present invention as a sputtering target, it is preferable that surface roughness be equal to or less than 1.5 µm, an electrical resistance be equal to or less than 1×10⁻⁴ Ω·cm, the amount of metal impurities be equal to or less than 0.1 atomic %, and a transverse strength be equal to or greater than 150 MPa. All of the examples satisfy these conditions.

The technological range of the present invention is not limited to the descriptions of the embodiments and the examples, and various changes in a range without departing from the scope of the present invention may be added.

For example, the sputtering targets of the embodiments and the examples have a plate-like shape. However, the sputtering target may have a cylindrical shape. More specifically, the sputtering target may have a disc plate-like shape, a short-side plate-like shape, a polygonal shape, and an elliptical plate-like shape, or a cylindrical shape.

INDUSTRIAL APPLICABILITY

It is possible to stably form a film by performing sputtering using an Ag—In alloy sputtering target according to the present invention.

The invention claimed is:

1. A Cu—Ga alloy sputtering target that is a sintered body having:
    a texture in which Na compound phases are dispersed in a matrix with a γ phase and a ζ phase of a Cu—Ga alloy; and
    a component composition made of: 20 atomic % to 30 atomic % of Ga; 1.3 atomic % to 10 atomic % of Na; and the Cu balance and inevitable impurities including elements other than Na in the Na compound, wherein
    an average grain size of the γ phase is 30 µm to 100 µm, and
    an average grain size of the Na compound phases is equal to or less than 8.5 µm.

2. The Cu—Ga alloy sputtering target according to claim 1, wherein
    a maximum grain size of the Na compound phases is equal to or less than 20 µm.

3. The Cu—Ga alloy sputtering target according to claim 1, wherein
    a main peak intensity in X-ray diffraction attributed to the ζ phase is equal to or more than 5% of a main peak intensity in X-ray diffraction attributed to the γ phase.

4. The Cu—Ga alloy sputtering target according to claim 1, wherein the Na compound phases are formed of at least one or more of NaF, $Na_2S$, $Na_2Se$, and $Na_3AlF_6$.

5. The Cu—Ga alloy sputtering target according to claim 1, wherein an oxygen content of the sintered body is equal to or less than 200 mass ppm.

6. A method of producing the Cu—Ga alloy sputtering target according to claim 1, the method comprising the step of performing pressureless sintering by heating a molded body formed from a powder mixture of a pure Cu powder, a Cu—Ga alloy powder, and a Na compound, in a reducing atmosphere.

7. The Cu—Ga alloy sputtering target according to claim 1, wherein the Na compound phases are formed of at least one or more of $Na_2S$, $Na_2Se$, and $Na_3AlF_6$.

* * * * *